United States Patent [19]
Chan et al.

[11] Patent Number: 6,005,790
[45] Date of Patent: Dec. 21, 1999

[54] FLOATING GATE CONTENT ADDRESSABLE MEMORY

[75] Inventors: Tsiu C. Chan; Thi N. Nguyen, both of Carrollton, Tex.

[73] Assignee: STMicroelectronics, Inc., Carrollton, Tex.

[21] Appl. No.: 09/219,546

[22] Filed: Dec. 22, 1998

[51] Int. Cl.$^6$ .................................................. G11C 14/00
[52] U.S. Cl. ...................................... 365/49; 365/185.18
[58] Field of Search .............................. 365/49, 185.05, 365/185.08, 185.18, 185.01, 185.26

[56] References Cited

U.S. PATENT DOCUMENTS

| | | | |
|---|---|---|---|
| 4,791,606 | 12/1988 | Threewitt et al. | 365/49 |
| 5,051,948 | 9/1991 | Watabe et al. | 365/49 |
| 5,111,427 | 5/1992 | Kobayashi et al. | 365/49 |
| 5,406,508 | 4/1995 | Hayashibara | 365/49 |
| 5,576,985 | 11/1996 | Holtz | 365/49 |

OTHER PUBLICATIONS

Sharma, Ashok K., "Semiconductor Memories, Technology, Testing, and Reliability," IEEE Press, Sec. 3.6.1, *Flash Memory Cells and Technology Developments*, pp. 123–125.

Hanyu, Takahiro et al., TP 2.5: "2–Transistor–Cell 4–Valued Universal–Literal CAM for a Cellular Logic Image Processor," 1997 IEEE Internationl Solid–State Circuits Conference Digest Of Technical Papers, First Edition, Feb., 1997, Session 2/TD: Vision Processors & CAMS/Paper 2.5, pp. 46–47.

Kramer, A. et al., TP 2.4 "55GCPS CAM Using 5b Analog Flash," 1997 IEEE International Solid–State Circuits Conference Digest Of Technical Papers, First Edition, Feb., 1997, Session 2/TD: Vision Processors & CAMS/Paper 2.4 pp. 44–45.

Miwa, Tohu et al., TP 2.5: "A 1Mb 2–Transistor/bit Non–Volatile CAM Based on Flash–Memory Technologies," 1996 IEEE International Solid–State Circuits Conference Digest Of Technical Papers, First Edition, Feb. 1996, Session 2/Flash Memory/Paper TP 2.5 pp. 40–41.

"What is a CAM (Content Addressable Memory)?" Application Brief AB–N6, Music Semiconductors, Jan. 16, 1998 Rev. 2, pp. 1–4.

Riccò, Bruno et al., "Nonvolatile Multilevel Memories for Digital Applications," Proceedings of the IEEE, vol. 86, No. 12, Dec. 12, 1998, pp. 2399–2411.

"Motorola to Begin Sampling 256K Content Addressable Memory (CAM) for High Performance Internetworking Applications," CAM Description, http://www.apspg.com/press/cam.html, pp. 1–2.

"Using CAM in Today's High–Speed Networks," isd Home, http://www.isdmag.com/design/CAM/CAM.html, pp. 1–7.

*Primary Examiner*—Trong Phan
*Attorney, Agent, or Firm*—David V. Carlson; Theodore E. Galanthay; Lisa K. Jorgenson

[57] ABSTRACT

A non-volatile storage device storing a data bit received from a bitline via an accessing circuit. A coupling circuit couples either the bitline, or a complementary bitline to a biasing circuit dependent on the logic level of the data bit stored in the storage device. The biasing circuit generates a match signal when a data bit having the same logic level as the stored data bit is applied to the bitline.

28 Claims, 4 Drawing Sheets

FLOATING GATE CONTENT ADDRESSABLE MEMORY

TECHNICAL FIELD

This invention relates generally to memory devices used in electrical devices, and more particularly, to non-volatile content addressable memory.

BACKGROUND OF THE INVENTION

Conventional content addressable memory (CAM) is a special type of memory. In contrast to RAM, in which a user provides an address, and data residing in that address is returned to the user, with CAM the user provides data, and the address containing the data is returned to the user. The CAM may also be programmed to return a predetermined signal in lieu of the location where the data is stored.

CAM is a potent type of memory. In addition to storing data, CAM inherently contains a search mechanism for identifying the location of a particular piece of data, and whether the data even exists within the CAM. To search for the location of data, the user inputs the data. The CAM compares the inputted data with the data stored in its memory cells. If a match is found between the inputted data and the stored data, a flag is set. The flag identifies that a match was found, and the location where the data was stored. Further, the CAM performs this comparison on every cell within the CAM simultaneously. Because every cell within the CAM is examined at the same time, the search is typically performed quicker than many other conventional searches used by non-CAM memory.

As mentioned above, in addition to telling the user where the data exists, the CAM may also tell the user whether the data exists at all within the CAM. Thus, CAM may be used as an enabling gate to trigger a response if a particular data configuration exists. For example, CAM may be used in a network to determine if a specific email address exists.

The data being searched for in the CAM may be a single bit, or a pattern of multiple bits. Typically, when multiple data bits are compared, the individual data bits are compared on a one-to-one basis. If each individual bit matches, the CAM enables the match signal, although partial matches may also be found and flagged.

Several deficiencies exist, however, with CAM. Any data stored in the CAM is lost when power is removed from the CAM. In addition, because of the large number of transistors required to store the data bit and perform the comparing, CAM cells require a relatively large amount of real estate. Thus, fewer CAM cells per given die area are possible than other types of memory, resulting in less storage capacity.

SUMMARY OF THE INVENTION

The present invention provides methods and apparatus for storing data in a non-volatile content addressable memory. A non-volatile storage device stores a data bit received from a bitline via an accessing circuit. A coupling circuit couples either the bitline, or a complementary bitline to a biasing circuit dependent on the logic level of the data bit stored in the storage device. The biasing circuit generates a match signal when a data bit having the same logic level as the stored data bit is applied to the bitline.

DETAILED DESCRIPTION OF THE INVENTION

Figure 1:
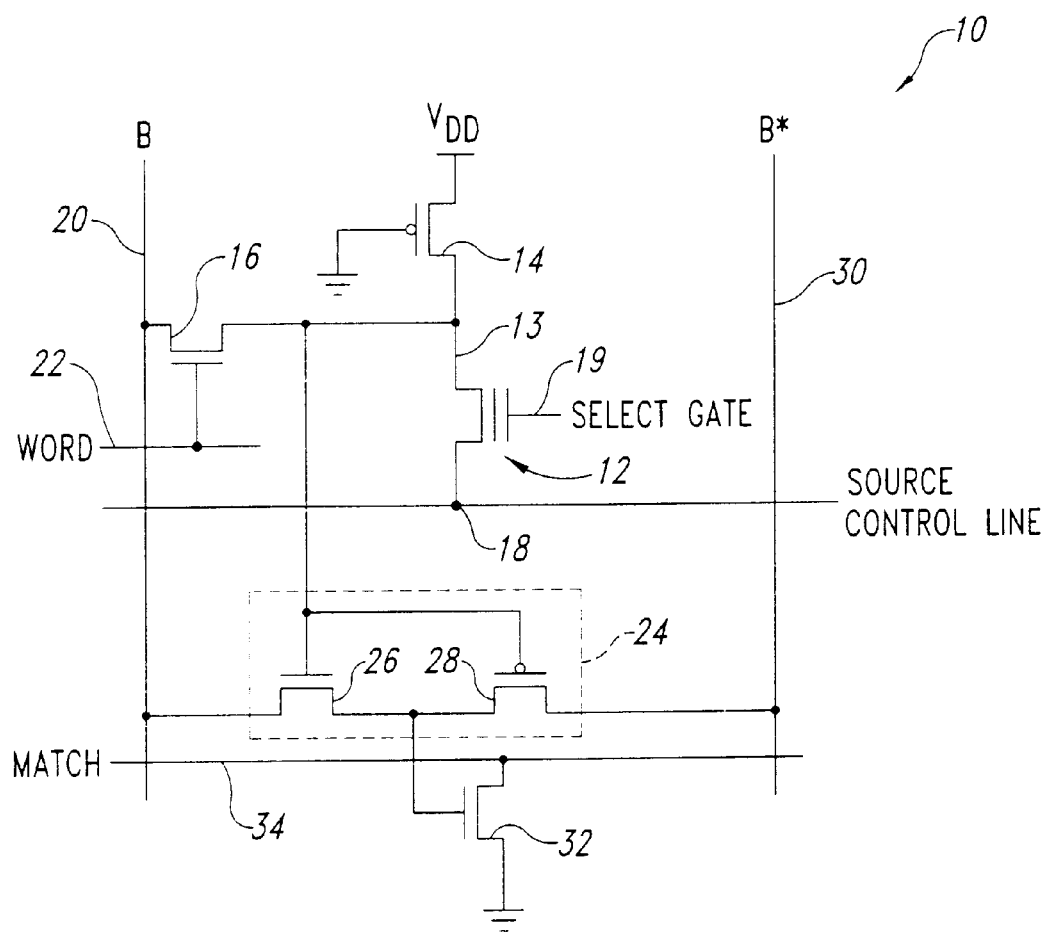
FIG. 1 is a schematic of a content addressable memory cell according to one embodiment of the invention.

FIG. 1 is a schematic of a content addressable memory cell ("CAM" cell) 10 according to one embodiment of the invention. The CAM cell 10 includes a non-volatile storage device such as a floating gate transistor 12 or other appropriate elements. The floating gate transistor 12 has a first input/output 13 coupled to a pull up device, such as a PMOS transistor 14, and is also coupled to an accessing device, such as an NMOS transistor 16. The floating gate transistor 12 has a second input/output coupled to a SOURCE CONTROL line 18 that is explained below. The floating gate transistor 12 also has a gate coupled to a SELECT GATE line 19 that is also explained below.

The PMOS transistor 14 has a gate coupled to a first voltage source, such as ground, so as to bias the PMOS transistor 14 ON. The PMOS transistor 14 also has a first input/output coupled to a second voltage source, such as VDD, and a second input/output coupled to the first input/output 13 of the floating gate transistor 12. The PMOS transistor 14 is typically fabricated to have a high channel resistance relative to the channel resistance of the floating gate transistor 12. This allows the PMOS transistor 14 to act as a relatively weak pull-up device. Other suitably adapted components may also be used as the pull-up device. For example, an NMOS transistor having its gate coupled to VDD, or a resistor may be substituted for the PMOS transistor 14.

The NMOS transistor 16 is coupled between the first input/output 13 of the floating gate transistor 12 and a bitline 20. A gate of the NMOS transistor 16 is coupled to a word line 22 to receive a select signal WORD.

The first input/output 13 of the floating gate transistor 12 is also coupled to a coupling circuit 24. In one embodiment the coupling circuit 24 includes an NMOS transistor 26 and a PMOS transistor 28 coupled in series between the bitline 20 and a complementary bitline 30. Gate's of the transistors 26, 28 are coupled together and to the first input/output 13 of the floating gate transistor 12. The coupling circuit 24 has an output at a node where the transistors 26, 28 are coupled together. Other configurations that are functionally similar may also be used for the coupling circuit 24.

A biasing circuit such as an NMOS transistor 32 is coupled to the output of the coupling circuit 24. A gate of the NMOS transistor 32 is coupled to the output of the coupling circuit 24. A first input/output of the NMOS transistor 32 is coupled to a MATCH line 34, and a second input/output is coupled to ground.

The floating gate transistor 12 may be programmed so that the transistor 12 is biased ON or OFF by ways known to those skilled in the art. For example, the SOURCE CONTROL line 18 is coupled to ground and the first input/output 13 is coupled to approximately 6 volts. The SELECT GATE line 19 is coupled to a higher voltage, such as approximately 12 volts, inducing a current between the first and second input/output of the floating gate transistor 12. Electrons are deposited on the floating gate of the floating gate transistor 13 via hot electron injection.

Another method commonly used to program the floating gate transistor 12 is Fowler-Nordheim tunneling, also known as cold electron tunneling, or just tunneling. With this technique, typically one of the input/outputs of the floating gate transistor 12, such as the SOURCE CONTROL line 18, is grounded, and a relatively high voltage, such as approximately 25 volts, is applied to the SELECT GATE line 19. This induces electrons onto the floating gate. While this technique is typically faster than the hot electron injection method described above, Fowler-Nordheim tunneling requires a much higher voltage, and a transistor capable of handling the higher voltage.

Electrons deposited on the floating gate shift the threshold voltage of the floating gate transistor 12 upward, requiring a larger voltage applied to the SELECT GATE line 19 to turn on the floating gate transistor. As a practical matter, this has the effect of biasing the floating gate transistor 12 OFF.

When electrons are removed from the floating gate, the floating gate becomes relatively more positively charged, shifting the threshold voltage of the floating gate transistor 12 downward. The threshold voltage is typically shifted to a negative voltage, thus biasing the floating gate transistor ON when the SELECT GATE line 19 floats.

Once the floating gate transistor is programmed, the SELECT GATE line 19 is decoupled from the voltage sources, and the SOURCE CONTROL line 18 is grounded. Thus, when the floating gate transistor is biased ON, a voltage equal to ground is applied to the first input/output 13 via the floating gate transistor 12. When the floating gate transistor is biased OFF, a voltage equal to approximately VDD is applied to the first input/output 13 via the weak pull-up transistor 14. Thus, a logic "0" and a logic "1" are effected at the first input/output 13.

Significantly, the floating gate transistor 12 remains programmed even if power is removed from the CAM cell 10. Thus, the CAM cell 10 is non-volatile memory.

As mentioned above, the channel resistance of the floating gate transistor 12 is fabricated to be relatively low as compared to the channel resistance of the PMOS transistor 14. Thus, when the floating gate transistor 12 is programmed ON, the first input/output 13 is biased to ground despite the efforts of the ON PMOS transistor 14 to pull up the first input/output 13 to VDD. However, when the floating gate transistor 12 is programmed OFF, the ON PMOS transistor 14 biases the first input/output 13 to VDD.

To determine if a particular data bit is stored by the floating gate transistor 12, the data bit and its complement are respectively applied to the bitline 20 and the complementary bitline 30. If the value of the data bit applied to the bitline 20 matches the value of the data that stored in the floating gate transistor 12, the MATCH line 34 is biased low via the transistor 32 as described below.

If, for example, a logic "1" is stored in the floating gate transistor 12, i.e., the transistor 12 is biased OFF, and the PMOS transistor 14 biases the first input/output 13 of the floating gate transistor to VDD, the transistor 26 will be ON, and the transistor 28 will be OFF. Thus, the value of the data bit applied to the bitline 20 will be applied to the gate of the transistor 32.

If the data bit applied to the bitline 20 is a logic "1", matching the value of the data that stored in the floating gate transistor 12, the transistor 32 will turn ON, biasing the MATCH line 34 to ground, indicating a match. If the value of the data bit applied to the bitline 20 is a logic "0", not matching the value of the data stored in the floating gate transistor 12, the logic "0" applied to the gate of the transistor 32 keeps the transistor 32 OFF. With the transistor 32 OFF, the MATCH line 34 is not biased to ground, thereby indicating that a match does not exist.

If, for example, the logic "0" is stored in the floating gate transistor 12, i.e., the floating gate transistor 12 is biased ON, coupling the first input/output 13 to ground through the floating gate transistor 12, the CAM cell 10 functions similarly to what is described above except the transistor 28 couples the complementary bitline 30 to the transistor 32. A logic "0" at the first input/output 13 applies a logic "0" to the gates of the transistors 26, 28, turning OFF the transistor 26, and turning ON the transistor 28 and thereby coupling the complementary bitline 30 to the gate of the transistor 32.

If the data bit applied to the bitline 20 is a logic "0", matching the value of the data that stored in the floating gate transistor 12, then the data bit applied to the complementary bitline is a logic "1." The logic "1" from the complementary bitline 30 is applied to the gate of the transistor 32 via the ON transistor 28, turning ON the transistor 32. The ON transistor 32 biases the MATCH line 34 to ground, indicating a match.

If the value of the data bit applied to the bitline 20 is a logic "1", not matching the value of the data stored in the floating gate transistor 12, then the data bit applied to the complementary bitline 30 is a logic "0." The logic "0" from the complementary bitline 30 is applied to the gate of the transistor 32 via the ON transistor 28, turning OFF the transistor 32. The OFF transistor 32 prevents the MATCH line 34 from being biased to ground, thereby indicating that a match does not exist.

Figure 2:
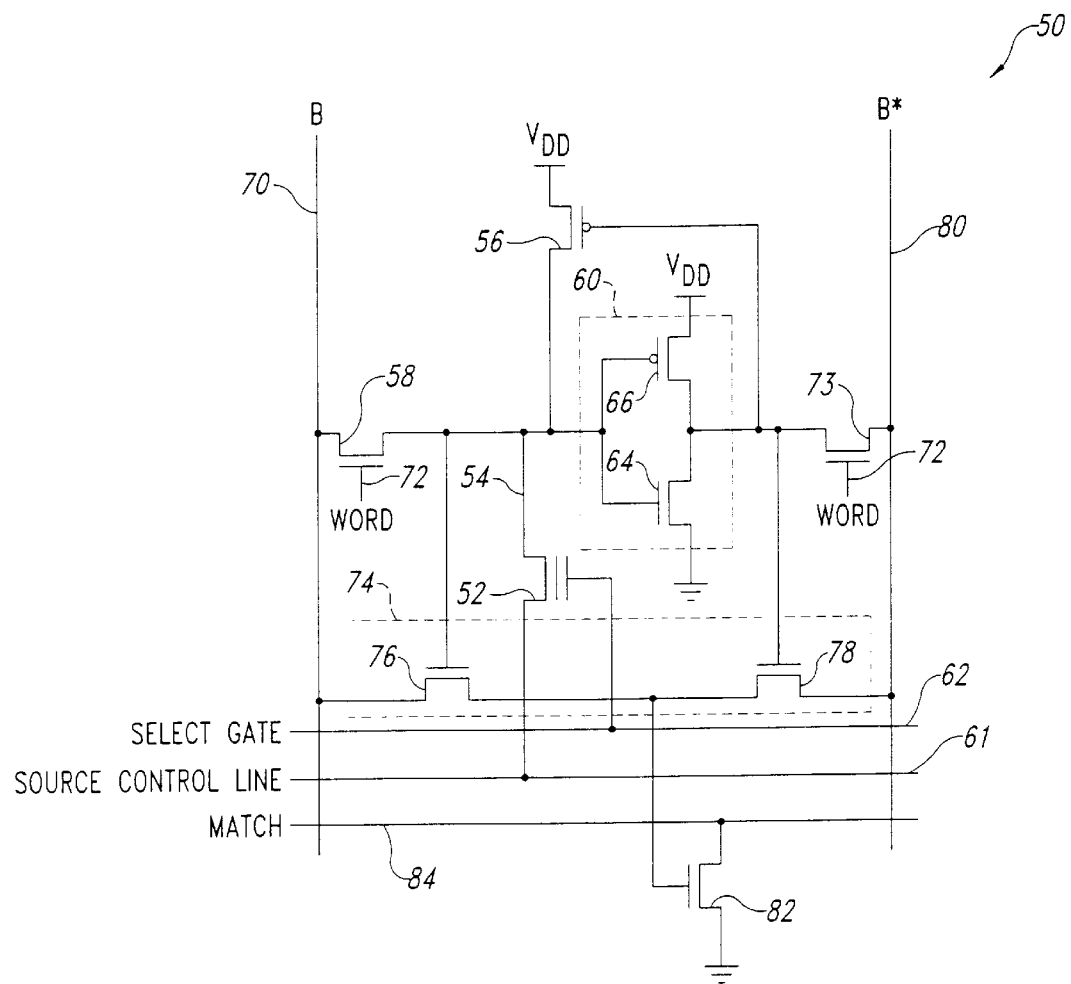
FIG. 2 is a schematic of a content addressable memory cell according to another embodiment of the invention.

FIG. 2 is a schematic of a CAM cell 50 according to another embodiment of the invention. The CAM cell 50 includes a non-volatile storage device, such as a floating gate transistor 52 or other appropriate elements. The floating gate transistor 52 has a first input/output 54 coupled to a pull up device, such as a PMOS transistor 56, an accessing device, such as an NMOS transistor 58, and an input to an inverter 60. The floating gate transistor 52 has a second input/output coupled to a SOURCE CONTROL line 61 that functions as explained above. The floating gate transistor 52 also has a gate coupled to a SELECT GATE line 62 that also functions as explained above.

The inverter 60 is typically made of an NMOS transistor 64 and a PMOS transistor 66 whose gates and drains are coupled together, and whose sources are coupled to respective first and second voltage sources, although other suitable components and arrangements may also be possible. The first and second voltage sources are typically voltage sources comprising a respective logic "0" and logic "1."

The PMOS transistor 56 has a gate coupled to an output of the inverter 60. The PMOS transistor 56 has a first input/output coupled to a second predetermined voltage source, such as VDD. The PMOS transistor 56 is typically fabricated to have a high channel resistance relative to the channel resistance of the floating gate transistor 12. This allows the PMOS transistor 56 to act as a relatively weak pull-up device. Other suitably adapted components may also be used as the pull-up device.

The NMOS transistor 58 is coupled between the first input/output 54 of the floating gate transistor 52 and a bitline 70. A gate of the NMOS transistor 58 is coupled to a word line 72 to receive a select signal WORD. A second accessing device, such as an NMOS transistor 73 is coupled between an output of the inverter 60 and a complementary bitline 80. A gate of the NMOS transistor 73 is coupled to the word line 72 to receive the select signal WORD.

The first input/output 54 of the floating gate transistor 52 is also coupled to a coupling circuit 74. In one embodiment the coupling circuit 74 includes NMOS transistors 76, 78 coupled in series between the bitline 70 and the complementary bitline 80. A gate of the transistor 76 is coupled to the first input/output 54 of the floating the transistor 52. A gate of the transistor 78 is coupled to an output of the inverter 60. The coupling circuit 74 has an output at a node where the transistors 76, 78 are coupled together. Other configurations that are functionally similar may also be used for the coupling circuit 74.

A biasing circuit such as an NMOS transistor 82 is coupled to the output of the coupling circuit 74. A gate of the NMOS transistor 82 is coupled to the output of the coupling circuit 74. A first input/output of the NMOS transistor 82 is coupled to a MATCH line 84, and a second input/output is coupled to ground.

In operation, a logic "1" or logic "0" may stored by the floating gate transistor 52 as described above with reference to the floating gate transistor 12.

To determine if a particular bit is stored by the floating gate transistor 52, the data bit and its complement are applied to the bitline 70 and complementary bitline 80. If the value of the data bit applied to the bitline 70 matches the value of the data that stored in the floating gate transistor 52, the MATCH line 84 is biased low via the transistor 82 as described below.

If, for example, a logic "1" is stored by the floating gate transistor 52, i.e., the floating gate transistor 52 is biased OFF, the CAM cell functions as described above with reference to FIG. 1, and will not be repeated in the interest of brevity.

If, for example, a logic "0" is stored by the floating gate transistor 52, i.e., the floating gate transistor 52 is biased ON, and the transistor 76 will be biased OFF. The transistor 78 will be biased ON by the inverter 60. Thus, the value of a data bit from the complementary bitline 80 will be applied to the gate of the transistor 82.

If the data bit applied to the bitline 70 is a logic "1", not matching the value of the data bit stored by the floating gate transistor 52, then the value applied to the complementary bitline 80 is a logic "0." The logic "0" is applied to the gate of the transistor 82 via the ON transistor 78, biasing the transistor 82 OFF. With the transistor 82 remaining OFF the MATCH line 84 is not biased to ground, thereby indicating that a match does not exist.

If the data bit applied to the bitline 70 is a logic "0", matching the value of the data bit stored by the floating gate transistor 52, then the value applied to the complementary bitline 80 is a logic "1." The logic "1" is applied to the gate of the transistor 82 via the ON transistor 78, biasing the transistor 82 ON. With the transistor 82 turning ON, the MATCH line 84 is biased to ground, thereby indicating that a match exists.

Figure 3:
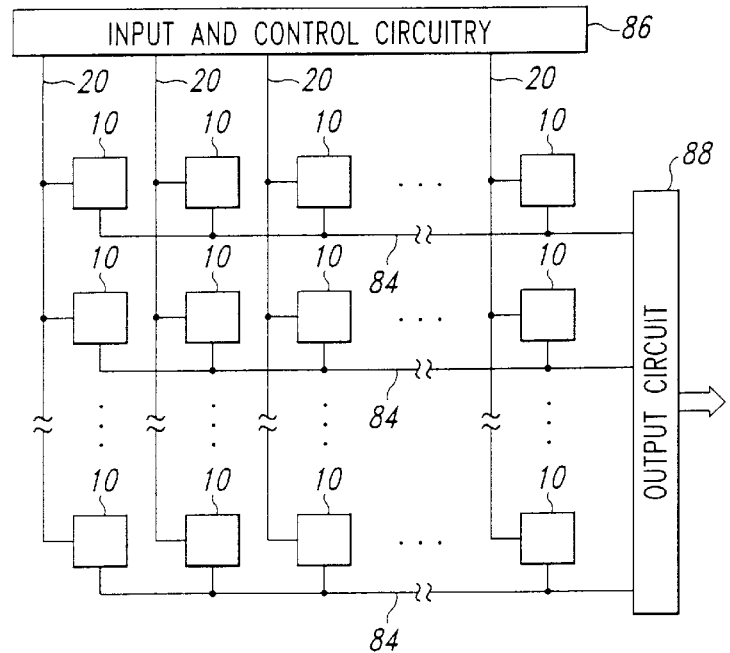
FIG. 3 is block diagram schematic of one embodiment of the inventive CAM cell formed in an array on an integrated circuit.

FIG. 3 illustrates an array of memory cells 10 of the type taught according to the invention formed on a single integrated circuit to provide computer useable memory. The structure includes input and control circuitry 86, an array of individual memory cells 10, bitlines 20, MATCH lines 84 and output circuit 88. Of course, additional addressing circuitry, such as word lines, SELECT GATE lines and SOURCE CONTROL lines are provided as needed; however, they are not shown in FIG. 3 for the sake of simplicity. The cell 10 can be of the type shown in FIG. 1 except having only a single bitline 20 connected to each memory cell or of the type shown in FIG. 2 in which the bitline and the complement bitline are both connected to the memory cell 10.

Chips having content addressable memories are well known in the marketplace today, and this CAM cell can be used as the macrocell providing the basic memory building block for the array. Arrays of this type are described in publications, including, for example, a publication titled "Two-Transistor-Cell Four-Valued Universal-Literal CAM for a Cellular Logic Image Processor," by Hanyu et al., IEEE International Solid State Circuits Conference, 1987, pp. 46, 47 (February 1997).

Figure 4:
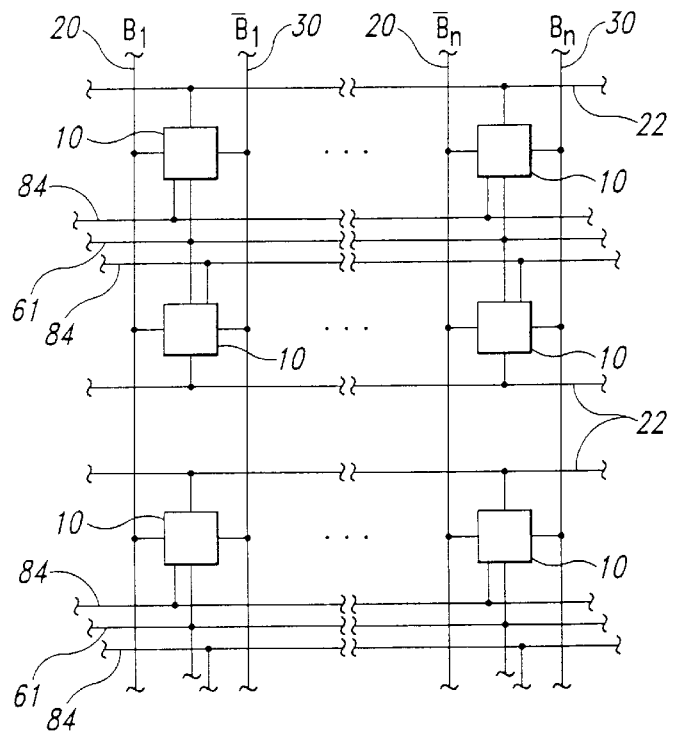
FIG. 4 shows possible connections to CAM cells in an array.
Figure 5:
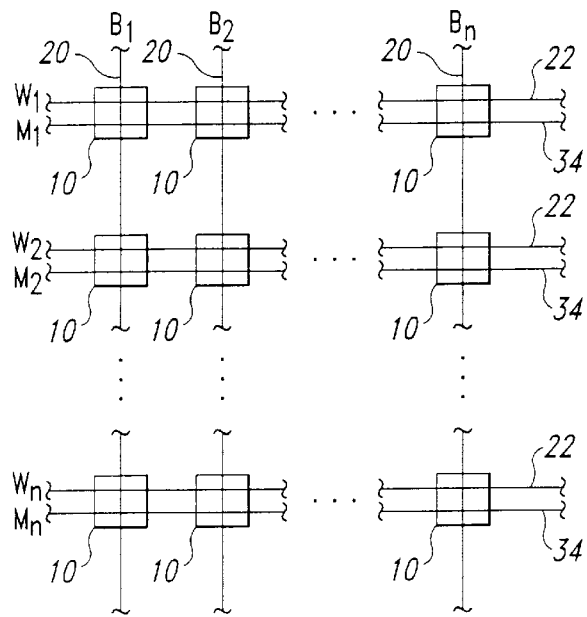
FIG. 5 shows a further alternative embodiment of CAM cell connections in an array.

FIGS. 4 and 5 show possible connections to the inventive memory cell 10 as formed in an array for use in a memory. According to the embodiment of FIG. 4, connected to each memory cell 10 is a bitline 20 and complement bitline 30. A MATCH line 84 as well as a word line 22 are connected to each memory cell in a given row. A source line 61 is connected to two adjacent rows. This provides a space-saving advantage, and also permits each of the rows to have their source brought to a common potential for ease in programming and erasing. In an alternative embodiment, each row has its own dedicated source line 61 and in a further alternative embodiment, the source lines 61 of all rows in the array are tied together so that all sources will be held at the same potential during various stages of memory access. A select line 62, as shown in FIG. 2, may also be provided for each memory cell. The select line 62 may be provided in a column form parallel to the bitlines 20 and 30 to permit selecting the gates of all memory cells 10 in a column together. Alternatively, the SELECT GATE line 62 can be connected parallel to the word line 22 to permit row selection if desired for a particular design.

FIG. 5 illustrates a further alternative embodiment of the memory cells organized in an array, this array being organized in a typical NOR structure. Word lines 22 are connected to each memory cell in a given row, as are MATCH lines 34. Bitlines 20 were also coupled to each memory cell 10 in the array. Additional programming and CONTROL lines can be provided as desired, as previously described herein.

Figure 6:
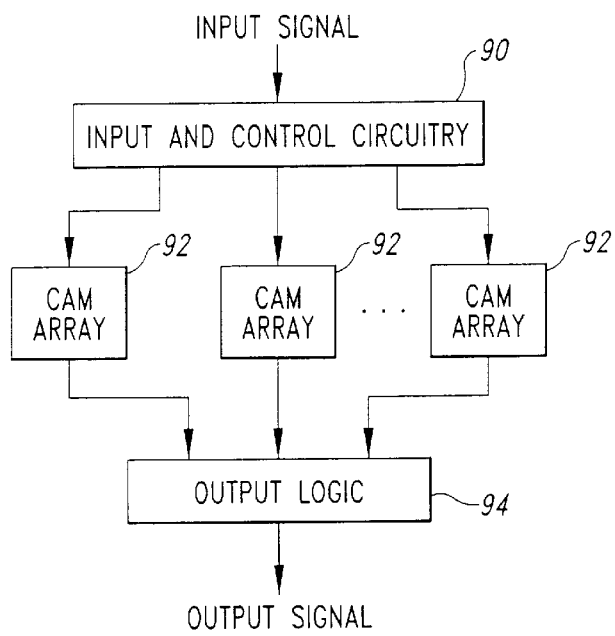
FIG. 6 shows a block diagram schematic of a plurality of arrays having common input signals and output through a common logic.

FIG. 6 illustrates the single integrated circuit having a plurality of CAM arrays constructed as described herein for providing fast access and output. Input signal and control circuitry 90 includes the necessary logic for accessing each cam as well as providing the input signal through to the CAM. Each of the CAM arrays 92 receives the appropriate input signal and processes it according to acceptable techniques. The output is provided to output logic 94 which provides an output signal. The output logic 94 in one embodiment is an OR gate. In another embodiment, it is a NOR gate, or other acceptable logic. The source control line can therefore be tied to another cell in a series (AND-type configuration,) or selectively grounded or selectively connected to the proper potential for the desired configuration, whether programming or reading or other function is desired.

Each CAM array, and the combination of CAM arrays 92 and 94 can be configured in any acceptable technique.

Of course, there are many types of array configurations, including NOR structures, exclusive-NOR, NAND, MATCH line driven, and others. Each of these types of configurations can be used in the array structures of FIGS.

3–6 with the appropriate line connections for the desired configuration. The array can be any desired size, for example, from 256K or smaller to over 1 MB or larger and in any desired width, such as 16-bit, 32-bit, 128-bit, or larger. Thus, a multi-bit data bus can be used as desired throughout the array and in many cases is shown as only a single line herein even though it may be a multi-bit bus. Therefore, the basic cell is useable in many different embodiments and configurations to provide a memory array according to principles of the present invention.

From the foregoing it will be appreciated that, although specific embodiments of the invention have been described herein for purposes of illustration, various modifications may be made without deviating from the spirit and scope of the invention. Accordingly, the invention is not limited except as by the appended claims

What is claimed is:

1. A content addressable memory cell for use with a memory array having a bitline, a complementary bitline, a match line, and a source control line, comprising:

a nonvolatile storage device coupled to the source control line, and operable to store a first data bit;

an accessing circuit coupled to the storage device and the bitline, the accessing circuit operable to couple the storage device to the bitline responsive to a first control signal;

a coupling circuit coupled to the storage device, the bitline, and the complementary bitline, the coupling circuit having an output and operable to couple the bitline to the output when the first data bit has a first logic level, and operable to couple the complementary bitline to the output when the first data bit has a second logic level;

a biasing circuit coupled to the match line, a first predetermined voltage, and the output of the coupling circuit, the biasing circuit operable to couple the first predetermined voltage to the match line when the output of the coupling circuit is the first logic level.

2. The content addressable memory cell of claim 1, further comprising:

a pull up device coupled to the storage device, the accessing circuit, and the coupling circuit, the pull up device operable to apply a second predetermined voltage to the storage device, the accessing circuit, and the coupling circuit.

3. The content addressable memory cell of claim 2 wherein the pull up device comprises a PMOS transistor having a gate operable to be coupled to the first predetermined voltage, a first input/output coupled to the second predetermined voltage, and a second input/output coupled to the storage device, the accessing circuit, and the coupling circuit.

4. The content addressable memory cell of claim 1 wherein the nonvolatile storage device comprises a floating gate transistor having a gate, a first input/output coupled to the accessing circuit and the coupling circuit, and a second input/output coupled to the source control line.

5. The content addressable memory cell of claim 1 wherein the accessing circuit comprises a transistor having a gate operable to receive the first control signal, a first input/output coupled to the bitline, and a second input/output coupled to the storage device.

6. The content addressable memory cell of claim 1 wherein the coupling circuit comprises:

an NMOS transistor having a gate coupled to the storage device, a first input/output coupled to the bitline, and a second input/output coupled to the biasing circuit;

a PMOS transistor having a gate coupled to the storage device, a first input/output coupled to the complementary bitline, and a second input/output coupled to the biasing circuit.

7. The content addressable memory cell of claim 1 wherein the biasing circuit comprises:

an NMOS transistor having a gate coupled to the output of the coupling circuit, a first input/output coupled to the match line, and a second input/output operable to be coupled to the first predetermined voltage.

8. The content addressable memory cell of claim 1 wherein the first logic level comprises a logic "1" and the second logic level comprises a logic "0."

9. The content addressable memory cell of claim 1 wherein the first predetermined voltage comprises ground.

10. The content addressable memory cell of claim 2 wherein the second predetermined voltage comprises $V_{DD}$.

11. The content addressable memory cell of claim 2, further comprising:

an inverter having an input coupled to the storage device and an output coupled to the pull up device; and a second accessing circuit coupled to the output of the inverter, the coupling circuit, and the complementary bitline, the second accessing circuit operable to couple the complementary bitline to the coupling circuit in response to the first control signal.

12. The content addressable memory cell of claim 11 wherein the pull up device comprises a PMOS transistor having a gate coupled to the output of the inverter, a first input/output operable to the second predetermined voltage, and a second input/output coupled to the storage device.

13. The content addressable memory cell of claim 11 wherein the second accessing circuit comprises an NMOS transistor having a gate operable to receive the first control signal, a first input/output coupled to the complementary bitline, and a second input/output coupled to the output of the inverter and the coupling circuit.

14. The content addressable memory cell of claim 11 wherein the coupling circuit comprises:

a first NMOS transistor having a gate coupled to the storage device, a first input/output coupled to the bitline, and a second input/output coupled to the biasing circuit;

a second NMOS transistor having a gate coupled to the output of the inverter and the second accessing circuit, a first input/output coupled to the complementary bitline, and a second input/output coupled to the biasing circuit.

15. A content addressable memory cell for use with a memory array having a bitline, a complementary bitline, a match line, and a source control line, comprising:

a floating gate transistor coupled to the source control line, and operable to store a first data bit;

an accessing circuit coupled to the storage device and the bitline, the accessing circuit operable to couple the storage device to the bitline responsive to a first control signal;

an enable signal generator coupled to the storage device, the bitline, and the complementary bitline, the enable signal generator operable to generate an enabling signal when the value of a second data bit on the bitline matches the value of the first data bit stored in the nonvolatile storage device; and a biasing circuit coupled to the enable signal generator to receive the enabling signal and to the match line, the biasing element operable to bias the match line to a first predetermined voltage responsive to receiving the enabling signal.

16. The content addressable memory cell of claim 15, further comprising:
a pull up device coupled to the storage device, the accessing circuit, and the coupling circuit, the pull up device operable to apply a second predetermined voltage to the storage device, the accessing circuit, and the enable signal generator.

17. The content addressable memory cell of claim 15 wherein the enable signal generator is operable to generate the enabling signal when the complement of the value of the first data bit stored in storage device matches the value of a third data bit on the complementary bitline.

18. The content addressable memory cell of claim 15 wherein the storage device comprises a floating gate transistor having a gate, a first input/output coupled to the accessing circuit and the enable signal generator, and a second input/output coupled to the source control line.

19. A content addressable memory cell for use with a memory array having a bitline, a complementary bitline, a match line, and a source control line, comprising:
a floating gate transistor having a first input/output, a second input/output, and a gate operable to receive a first control signal;
a first PMOS transistor having a gate coupled to a first voltage source, a first input/output coupled to a second voltage source, and a second input/output coupled to the first input/output of the floating gate transistor;
a first NMOS transistor having a gate operable to receive a second control signal, a first input/output coupled to the bitline, and a second input/output coupled to the first input/output of the floating gate transistor;
a second NMOS transistor having a gate coupled to the first input/output of the floating gate transistor, a first input/output coupled to the bitline, and a second input/output;
a second PMOS transistor having a gate coupled to the first input/output of the floating gate transistor, a first input/output coupled to the complementary bitline, and a second input/output coupled to the second input output of the second NMOS transistor;
a third NMOS transistor having a gate coupled to the second input/output of the second NMOS transistor, a first input/output coupled to the first voltage source, and a second input/output coupled to the match line.

20. A content addressable memory array, comprising:
a plurality of memory cells, arranged in rows and columns;
a word line coupled to each cell in a first row;
a bitline coupled to each cell in a first column;
a match line coupled to each memory cell in the array;
a floating gate transistor within each memory cell in the array;
an access transistor within each memory cell coupled to the bitline and the floating gate transistor to operably couple the bitline to the floating gate memory; and
a biasing transistor within each memory cell coupled to the match line and to a coupling circuit that is coupled to the floating gate transistor, the biasing circuit operable to couple a first predetermined voltage to the match line when an output of the coupling circuit is at a first logic level.

21. The array according to claim 20 wherein said match line is coupled to each memory cell in said first row.

22. The array according to claim 20 wherein said match line is coupled to each memory cell in said first column.

23. The array according to claim 20, further including a source access line coupled to each memory cell in the first row and each memory cell in an adjacent row to the first row such that each floating gate transistor in both said first and second rows have a common source line.

24. The array according to claim 20, further including a select gate line coupled to each memory cell in the first row.

25. The array according to claim 20, further including a select gate line individually coupled to each memory cell in the array.

26. The array according to claim 20, further including a select gate line coupled to each memory cell in the first column.

27. A method for using a memory cell having a bitline and a complementary bitline, comprising:
programming a floating gate transistor with a logic level;
applying an address bit to the bitline;
comparing the address applied to the bitline with the logic level stored by the floating gate transistor; and
generating a match signal when the address applied to the bitline corresponds to the logic level stored by the floating gate transistor by coupling a match line to a first predetermined voltage.

28. The method of claim 21, further comprising:
applying the complement of the address bit to the complementary bitline;
comparing the logic level of the bit applied to the complementary bitline with the logic level stored in the floating gate transistor; and
generating the match signal when the logic level applied to the complementary bitline corresponds to the complement of the logic level stored in the floating gate transistor.

* * * * *